(12) United States Patent
Vasen et al.

(10) Patent No.: US 10,672,899 B2
(45) Date of Patent: Jun. 2, 2020

(54) TUNNEL FIELD-EFFECT TRANSISTOR WITH REDUCED TRAP-ASSISTED TUNNELING LEAKAGE

(71) Applicant: Taiwan Semiconductor Manufacturing Co., Ltd., Hsinchu (TW)

(72) Inventors: Timothy Vasen, Tervuren (BE); Gerben Doornbos, Kessel-Lo (BE); Matthias Passlack, Huldenberg (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/194,140

(22) Filed: Nov. 16, 2018

(65) Prior Publication Data

US 2020/0006542 A1    Jan. 2, 2020

Related U.S. Application Data

(60) Provisional application No. 62/692,245, filed on Jun. 29, 2018.

(51) Int. Cl.
| | |
|---|---|
| *H01L 29/06* | (2006.01) |
| *H01L 29/775* | (2006.01) |
| *H01L 29/205* | (2006.01) |
| *H01L 29/66* | (2006.01) |
| *H01L 29/10* | (2006.01) |
| *H01L 29/08* | (2006.01) |

(52) U.S. Cl.
CPC ........ *H01L 29/775* (2013.01); *H01L 29/0847* (2013.01); *H01L 29/1037* (2013.01); *H01L 29/205* (2013.01); *H01L 29/66462* (2013.01)

(58) Field of Classification Search
CPC .................... H01L 29/0665; H01L 29/0669
See application file for complete search history.

(56) References Cited

U.S. PATENT DOCUMENTS

| | | | |
|---|---|---|---|
| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |

(Continued)

OTHER PUBLICATIONS

Zhou et al., "Novel gate-recessed vertical InAs/GaSb TFETs with record high $I_{ON}$ of 180 μA/μm at $V_{DS}$= 0.5 V," *International Electron Devices Meeting*, San Francisco, CA, USA, Dec. 10-13, 2012. (4 pages).

*Primary Examiner* — Jae Lee
(74) *Attorney, Agent, or Firm* — Seed IP Law Group LLP

(57) ABSTRACT

The current disclosure describes a tunnel FET device including a P-I-N heterojunction structure. A high-K dielectric layer and a metal gate wrap around the intrinsic channel layer with an interlayer positioned between high-K dielectric layer and the intrinsic channel layer of the P-I-N heterojunction. The interlayer prevents charge carriers from reaching the interface with high-K dielectric layer under the trap-assisted tunneling effect and reduces OFF state leakage.

17 Claims, 8 Drawing Sheets

(56) References Cited

U.S. PATENT DOCUMENTS

| | | |
|---|---|---|
| 9,853,101 B2 | 12/2017 | Peng et al. |
| 9,881,993 B2 | 1/2018 | Ching et al. |
| 2007/0241367 A1* | 10/2007 | Ouyang .............. H01L 29/778 257/190 |

* cited by examiner

TUNNEL FIELD-EFFECT TRANSISTOR WITH REDUCED TRAP-ASSISTED TUNNELING LEAKAGE

BACKGROUND

Metal-oxide-semiconductor (MOS) field-effect transistors (FET) have been a dominating technology for integrated circuits. A MOSFET can work in three regions, depending on gate voltage $V_g$ and source-drain voltage $V_{ds}$. These three regions include linear, saturation, and sub-threshold regions. The sub-threshold region is a region wherein gate voltage $V_g$ is smaller than threshold voltage $V_t$. The sub-threshold swing represents the easiness of switching the transistor current off and is an important factor in determining the speed and power of a MOS device. The sub-threshold swing can be expressed as a function of m*kT/q, wherein m is a parameter related to capacitance. The sub-threshold swing of conventional MOS devices has a limit of about 60 mV/decade (kT/q) at room temperature, which in turn sets a limit for further scaling of operation voltage $V_{DD}$ and threshold voltage $V_t$. This limitation is due to the drift-diffusion transport mechanism of carriers. For this reason, existing MOS devices typically cannot switch faster than 60 mV/decade at room temperatures. The 60 mV/decade sub-threshold swing limit also applies to FinFET or ultra-thin body MOSFET on silicon-on-insulator (SOI) devices. Therefore, with better gate control over the channel, a newer ultra-thin body MOSFET on SOI or a finFET can achieve a sub-threshold swing close to, but not below, the limit of 60 mV/decade. With such a limitation, faster switching at low operation voltages for future nanometer devices is challenging to achieve.

The tunnel field-effect transistor (TFET) is a newer type of transistor. TFETs switch by modulating quantum tunneling through a barrier. Because of this, TFETs are not limited by the thermal Maxwell-Boltzmann tail of carriers, which limits MOSFET subthreshold swing to about 60 mV/decade of current at room temperature.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
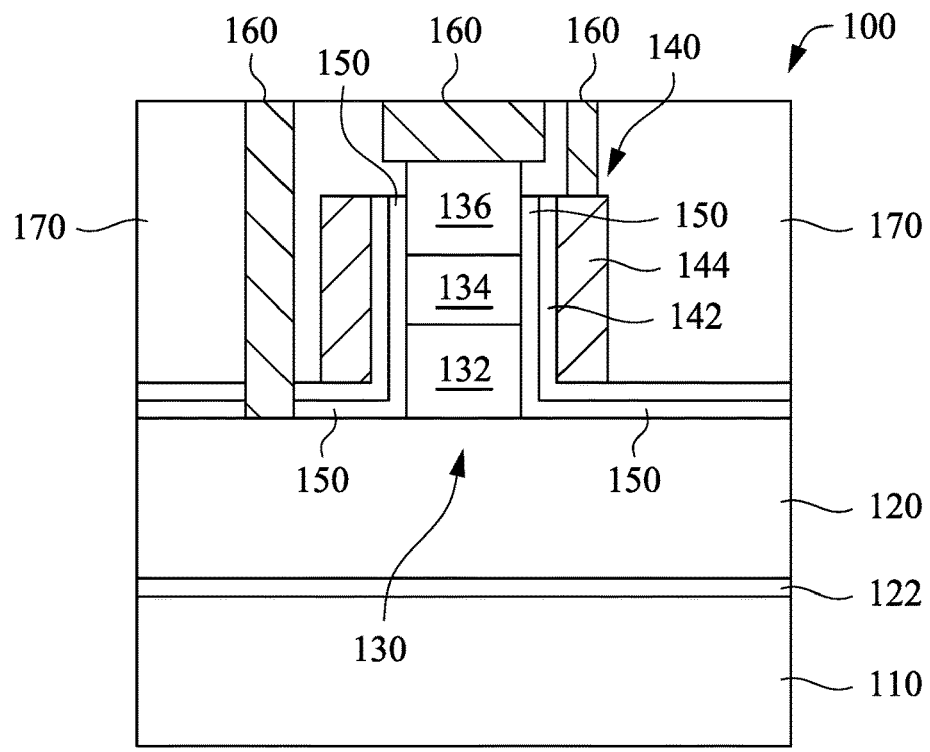
FIGS. 1-5 illustrate example TFET structures according to embodiments of the disclosure.

The disclosed techniques are directed to tunnel field-effect transistors (TFET) that have an interlayer of semiconductor material positioned between a channel layer and a gate structure. A TFET transistor includes a source of a first conductivity type, a drain of a second conductivity type, an intrinsic or unintentionally doped channel, a gate adjacent to the channel, which includes a gate electrode and a high-K gate dielectric, and an interlayer positioned between the high-K gate dielectric and the channel. In an embodiment, a material of the interlayer includes a wider bandgap than a material of the channel. The existence of the additional interlayer between the channel and the high-K gate dielectric increases the physical distance for charge carriers to reach the interface of the semiconductor/dielectric junction from the channel layer under the trap-assisted tunneling (TAT) effect and also increases the energy barrier for TAT tunneling. At the same time, the major band to band tunneling (BTBT) effect from the source to the drain through the channel is not affected by the additional interlayer because the interlayer is not in the route of the BTBT. With the TAT tunneling effect being suppressed, the subthreshold swing (SS) of the TFET is decreased and the OFF-state current, i.e., the leakage current, is reduced.

An example core-shell TFET structure includes a substrate and a base layer of a first III-V compound semiconductor material (III-V material), e.g., InAs, over the substrate. A III-V compound semiconductor material refers to a chemical compound with at least one group III element (the chemical elements in group 3 of the periodic table, also called the boron group) and at least one group V element (chemical elements in group 5 of the periodic table, also called the nitrogen family). A nanowire core structure is formed over the base layer. The core structure includes a drain structure of the first III-V material InAs over the base layer, a barrier layer of a second III-V material, e.g., GaAs, over the drain structure, and a source structure of a third III-V material, e.g., GaSb, over the barrier layer. A channel layer of an III-V material, e.g., InAs, wraps around and contacts both the source structure and the drain structure. An interlayer of a semiconductor material, e.g., GaAs or InP, wraps around the channel layer. A gate structure wraps around the interlayer. The interlayer of GaAs or InP includes a large conduction band offset $\Delta E_c$, with respect to the channel layer of InAs. The drain structure is doped as a first conductivity type, e.g., N-type, and the source structure is doped as a second different conductivity type, e.g., P-type. The channel layer is intrinsic or unintentionally doped (UID), e.g., as N-type.

An example axial vertical TFET structure includes a substrate and a base layer of a first III-V material, e.g., P doped GaN, over the substrate. A nanowire source structure of the first III-V material, P-doped GaN, is formed over the base layer. A nanowire channel layer of a second III-V material, e.g., intrinsic or unintentionally doped InN or InGaN, is formed over the source structure. A nanowire drain structure of a III-V material, e.g., N-doped GaN, is formed over the channel layer. An interlayer of a semiconductor material wraps around at least the channel layer. A material of the interlayer layer includes a large conduction band offset ($\Delta E_c$) with respect to the channel layer of InN/InGaN. For example, the interlayer is AlN. A gate structure wraps around the interlayer layer. The interlayer separates the gate structure from the channel layer. In the case that the gate structure is also adjacent to the source structure or the drain structure, the interlayer also extend toward the source structure or the drain structure to separate the gate structure from them. A material of the interlayer layer includes a large conduction band offset ($\Delta E_c$) with respect to a material of the channel layer and the relevant source or drain structure if adjacent to the gate structure.

Further, in the cases that the interlayer also contacts one or more of the source or the drain, a material of the interlayer includes a wider bandgap than the channel layer with respect to the one or more of the source or the drain. That is, the interlayer includes a larger tunneling barrier than the channel layer such that the BTBT tunneling occurs through the channel layer instead of the interlayer.

In the above examples, the core-shell TFET includes a lateral tunneling and the axial TFET includes a vertical tunneling. In other examples, a core-shell TFET having a vertical BTBT or an axial TFET having a lateral BTBT are also possible and included in the disclosure. The interlayer between the gate and the channel layer may also be used in TFET devices that include both vertical and lateral tunneling components.

For example, an example lateral axial TFET structure includes a substrate and a source region, a channel region and a drain region over the substrate. The channel region is positioned laterally between the source region and the drain region. A gate structure is positioned adjacent to the channel region. An interlayer is positioned between the gate structure and the channel region. A material of the interlayer includes a large conduction band offset ($\Delta E_c$) with respect to a material of the channel region.

The existence of the wide bandgap semiconductor interlayer between the semiconductor channel and gate dielectric layer moves the interface traps further away from the tunnel junction both spatially and energetically. The TAT tunneling barrier is increased and the energy required for the thermal emission out of a trap is also increased. The desired main band-to-band tunneling "BTBT" is not affected by the additional interlayer because the interlayer is not in the route of the BTBT. Accordingly, the tunneling length (spatial and energetic) for the BTBT tunneling and the tunneling length for the TAT tunneling are decoupled from one another and are adjusted separately. As the TAT tunneling effects are suppressed, the Off state current is reduced and the sub-threshold swing ("SS") is decreased, i.e., improved.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The following description refers to a transistor as an example of a semiconductor structure to which the present description applies; however, the present description is not limited in applicability to transistors. For example, the follow description applies to other types of semiconductor structures that are not transistors where the reduced TAT effects are desirable.

FIG. 1 illustrates an example axial TFET device 100. As shown in FIG. 1, the TFET device 100 includes a substrate 110, e.g., a silicon substrate, and a base layer 120 of a first semiconductor material, e.g., gallium nitride "GaN", over the substrate. In some embodiments, a nucleation layer 122, e.g., of aluminum nitride "AlN", is disposed between the substrate 110 and the base layer 120. The base layer 120 is doped as a first conductivity type, e.g., P-type. A vertical heterojunction stack 130 is formed over the base layer 120. For example, the vertical stack 130 is a stack of nanowire structures. The nanowire stack 130 includes a nanowire source layer 132 of the first conduction type, e.g., P-type, an intrinsic or unintentionally doped (UID) nanowire channel layer 134, and a nanowire drain layer 136 of a second conductivity type, e.g., N-type. A gate structure 140 is formed adjacent to the channel layer 134. In an embodiment, as shown in FIG. 1, the gate structure 140 wraps around the channel layer 134. The gate structure 140 includes a gate dielectric layer 142, e.g., of a high-K dielectric material, and a gate electrode 144.

An interlayer 150 is formed between the gate structure 140 and the channel layer 134, or specifically between the gate dielectric 142 and the channel layer 134. In an embodiment, the interlayer 150 includes a semiconductor material that has a large conduction band offset (or valence band offset) with respect to the channel layer 134 such that the conduction band energy of the interlayer 150 is much larger than the conduction band energy of the channel layer 134. Resultantly, the energy barrier is increased for the tunneling to the interface with the gate dielectric layer 142, and the TAT tunneling current is thus decreased. For example, in case the channel layer 134 is InN or InGaN, the interlayer 150 is AlN.

In an embodiment, as shown in FIG. 1, the gate structure 140 also laterally adjacent to or overlaps at least partially one or more of the source layer 132 or the drain layer 136 and the interlayer 150 extends between the gate structure 140 and the adjacent source layer 132 and the drain layer 136. As such the source layer 132 and the drain layer 136 are also separated from the gate structure 140 by the interlayer 150, which prevents the charge carriers trapped in the source layer 132 or the drain layer 136 from reaching the interface of the gate dielectric layer 142. In an embodiment, the interlayer 150 has a large conduction band offset with respect to the source layer 132 and the drain layer 136 such that the TAT tunneling current, i.e., leakage, from the source layer 132 or the drain layer 136 to the high-K dielectric layer 142 can be reduced. Further, the interlayer 150 has a larger tunneling barrier than the channel layer 134. For example, the interlayer 150 has a larger energy offset or bandgap, i.e., between the valence band on one side of the junction and the conduction band on the other side of the junction, with respect to the source layer 132 than the channel layer 134 such that it is ensured that the band-to-band tunneling BTBT occurs through the channel layer 134 instead of the interlayer 150. That is, the interlayer 150 has a wider bandgap than the channel layer 134. As described above, AlN is a suitable material for the interlayer 150 because it has valence band offset and conduction band offset against both InN and GaN and it has a wider bandgap than InN.

Further because the interlayer 150 includes a large conduction band offset with respect to the channel layer 134, the electron under the TAT tunneling effects needs extra energy to reach the interface between the interlayer 150 and the high-K dielectric layer 142. In other words, in the case that the conduction band energy of the interlayer 150 is much larger than the trap energy under the TAT effect, the TAT current is substantially reduced under the algorithm below:

$$e_n \propto e^{-\Delta E}, \text{ and}$$

$$\Delta E = E_c - E_t,$$

where $e_n$ is electron density, $E_t$ is the energy level of the interface traps and $E_c$ is the conduction band energy, e.g., the conduction band offset between the interlayer 150 and the channel layer 134.

In an embodiment, to maintain the gate control on the BTBT tunneling through the channel layer 134, the thickness of the interlayer 150 is controlled to be thin. For example, in an embodiment, the interlayer 150 includes a thickness ranging from about 1 nm to about 5 nm.

In an embodiment, the source layer 132 includes a thickness ranging from about 5 nm to about 30 nm, the channel layer 134 includes a thickness ranging from about 2 nm to about 20 nm, and the drain layer 136 includes a thickness ranging from about 5 nm to about 50 nm.

The example device 100 also includes interconnection/contact structures 160 and inter-level dielectrics 170.

Figure 2:
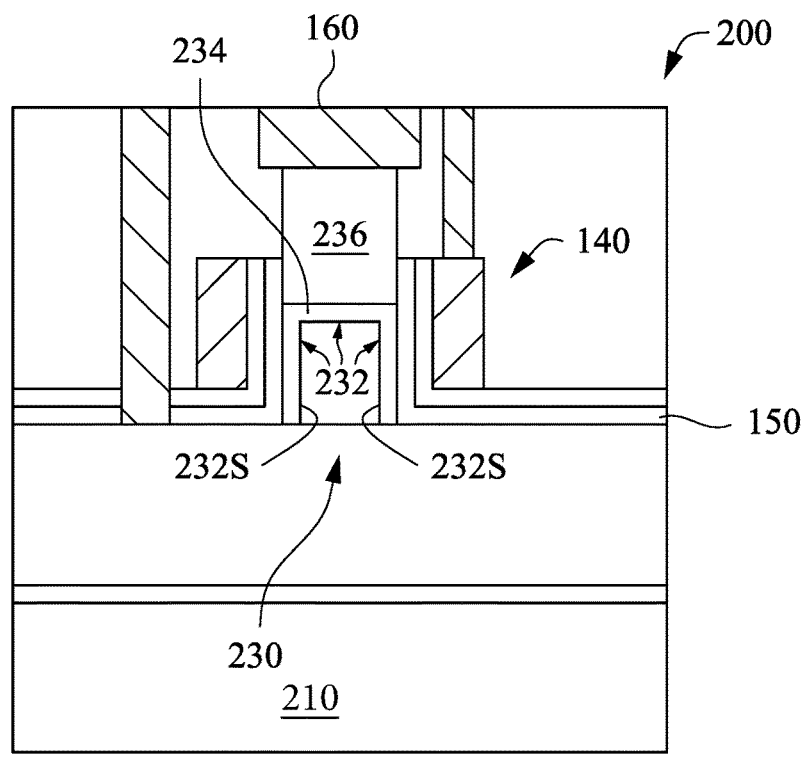

FIG. 2 shows another example device 200. The device 200 is similar to the device 100 of FIG. 1 except that in the vertical stack of semiconductor layers 230, the channel layer 234 is formed over the source layer 232 and also adjacent to the sidewall 232S of the source layer 232. The drain layer 236 is formed over the channel layer 234.

As such, in the device 200, the BTBT tunneling includes both vertical components and lateral components, as illustratively shown with the arrows. For the lateral components of the BTBT tunneling, as the charge carrier movement direction is in parallel with the gate electrical field, the gate control of the BTBT current is improved. As the interlayer 150 of AlN includes a wider bandgap and larger tunneling barrier than the channel layer 234, the BTBT tunneling does not go through the interlayer 150.

In the devices 100, 200, the N-type TFETs of P-doped GaN source, intrinsic or UID InN channel, and N-doped GaN drain are used as illustrative examples, which does not limit the scope of the disclosure. An interlayer 150 may also be used in P-type TFETs and/or TFETs with other combinations of semiconductor materials. For example, in a P-type TFET, the source layer may be N-doped indium arsenide InAs, the channel layer may be intrinsic (or UID) InAs, and the drain layer may be P-doped gallium antimonide GaSb. The interlayer 150 may be gallium arsenide GaAs. In another P-type TFET, the source layer may be N-doped InAs, the channel layer may be intrinsic (or UID) InAs, and the drain layer may be P-doped silicon. The interlayer may be GaAs or indium phosphide InP. Other combinations of semiconductor materials are also possible and included in the disclosure.

Figure 3:
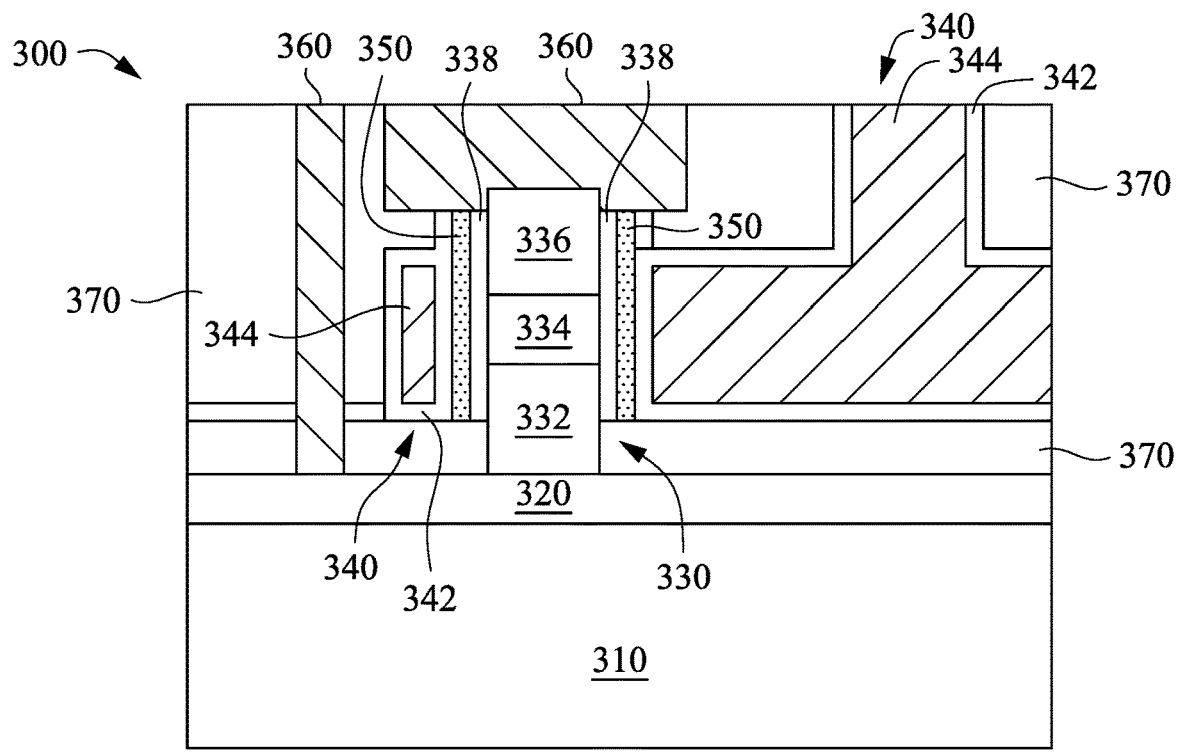

FIG. 3 shows an example core-shell TFET device 300. The device 300 includes a substrate 310, e.g., a silicon substrate, and a base layer 320 of a first semiconductor material, e.g., InAs, over the substrate 310. The base layer 320 is doped as a first conductivity type, e.g., N-type. A vertical heterojunction core stack 330 is formed over the base layer 320. For example, the vertical core stack 330 includes nanowire structures. The core stack 330 includes a drain layer 332 of the same semiconductor material as the base layer 320 and doped as the first conduction type, e.g., N-type, an intrinsic or unintentionally doped UID barrier layer 334 of a second semiconductor material, e.g., GaAs, and a source layer 336 of a third semiconductor material, e.g., GaSb, and doped as a second conductivity type, e.g., P-type. A channel layer 338 is formed adjacent to and contacting both the drain layer 332 and the source layer 336. The channel layer 338 includes a fourth semiconductor material and is intrinsic or UID. In an example, the fourth semiconductor material includes intrinsic InAs. The InAs material of the channel layer 338 is different from the InAs material of the drain layer 332 in that the InAs of the channel layer is intrinsic or UID, and the UID InAs of the channel layer 334 includes a smaller doping concentration than the N-doped InAs in the drain layer 332. A gate structure 340 is formed adjacent to the channel layer 338. In an embodiment, as shown in FIG. 3, the channel layer 338 is shell-shaped and wraps around the drain layer 332 and the source layer 336, and the gate structure 340 wraps around the channel layer 338. The gate structure 340 includes a gate dielectric layer 342, e.g., of a high-K dielectric material, and a gate electrode 344.

In an embodiment, the barrier layer 334 include a larger tunneling barrier than the channel layer 338 with respect to the source layer 336 so that the BTBT tunneling occurs through the channel layer 338 instead of the barrier layer 334. For example, the barrier layer 334 may include a wider bandgap than the channel layer 338 and may include at least one of a larger conduction band offset or a larger valence band offset with respect to the source layer 336 than the channel layer 338. The existence of the barrier layer 334 may reduce leakage current at the OFF state of the gate 340. At the ON state of the gate 340, the gate voltage field is in parallel with the BTBT tunneling from the source layer 336 to the channel layer 338, which improves gate control of the BTBT tunneling.

An interlayer 350 is formed between the gate structure 340 (or specifically the gate dielectric 342) and the channel layer 338. More specifically, the interlayer 350 completely intervenes between the gate dielectric layer 342 and the channel layer 338 such that a trapped charge carrier, i.e., an electron or a hole, in the channel layer 338 cannot reach the gate dielectric layer 342 without going through the interlayer 350. The interlayer 350 may completely overlap or cover the gate structure 340 in the direction between the gate structure 340 and the core stack 330 or completely covers/overlaps the channel layer 334 in the direction between the gate structure 340 and the core stack 330. In an embodiment, the interlayer 350 includes a semiconductor material that has a large conduction band offset with respect to the channel layer 338 such that the conduction band energy of the interlayer 350 is much larger than the trap energy through the channel layer 338 and the TAT current is decreased. For example, in the case that the channel layer 338 is InAs, the interlayer 350 is GaAs or indium phosphide InP.

The core-shell TFET 300 also includes contact structures 360 and inter-level dielectric 370.

Figure 4:
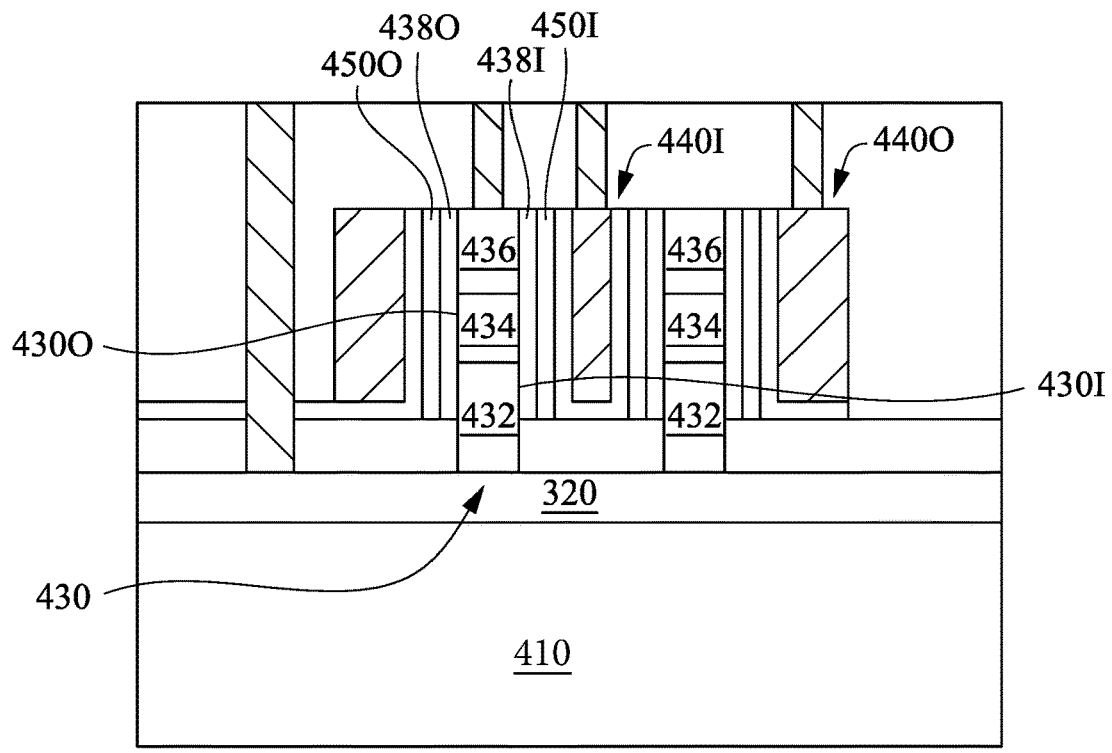

FIG. 4 shows another example core-shell TFET 400. The core-shell TFET 400 is similar to the core-shell TFET 300 of FIG. 3 except that the TFET 400 includes an inner gate structure 440I and an outer gate structure 440O. The inner gate structure 440I is inside a ring-shaped semiconductor stack 430 and the outer gate structure 440O is outside the ring-shaped semiconductor stack 430. Each of the inner gate structure 440I and the outer gate structure 440O includes a gate dielectric and a gate electrode.

The semiconductor stack 430 includes a drain layer 432, a barrier layer 434 and a source layer 436. Two channels layers 438O and 438I are positioned adjacent to and contacting both the source layer 436 and the drain layer 432 from outer sidewalls thereof (FIG. 4 shows only a single outer side wall 430O as an illustrative example) and inner sidewalls thereof (FIG. 4 shows only a single inner side wall 430I as an illustrative example), respectively. Specifically, in an embodiment, the inner channel layer 438I surround both the source layer 436 and the drain layer 432 by being wrapped around by the source layer 436 and the drain layer 432. The outer channel layer 438O surrounds both the source layer 436 and the drain layer 432 by wrapping around both the source layer 436 and the drain layer 432.

An outer interlayer 450O is positioned between the outer gate structure 440O and the outer channel layer 438O. An inner interlayer 450I is positioned between the inner gate structure 440I and the inner channel layer 438I. In an embodiment, the outer interlayer 450O includes a semiconductor material that has a large conduction band offset with respect to the outer channel layer 438O such that the conduction band energy of the outer interlayer 450 is much larger than the trap energy through the outer channel layer 438O and the TAT current is decreased. In an embodiment, the inner interlayer 450I includes a semiconductor material that has a large conduction band offset with respect to the inner channel layer 438I such that the conduction band energy of the inner interlayer 450I is much larger than the trap energy through the inner channel layer 438I and the TAT current is decreased. For example, in the case that the inner channel layer 438I and the outer channel layer 438O are InAs, the inner interlayer 450I and the outer interlayer 450O are GaAs or InP.

Figure 5:
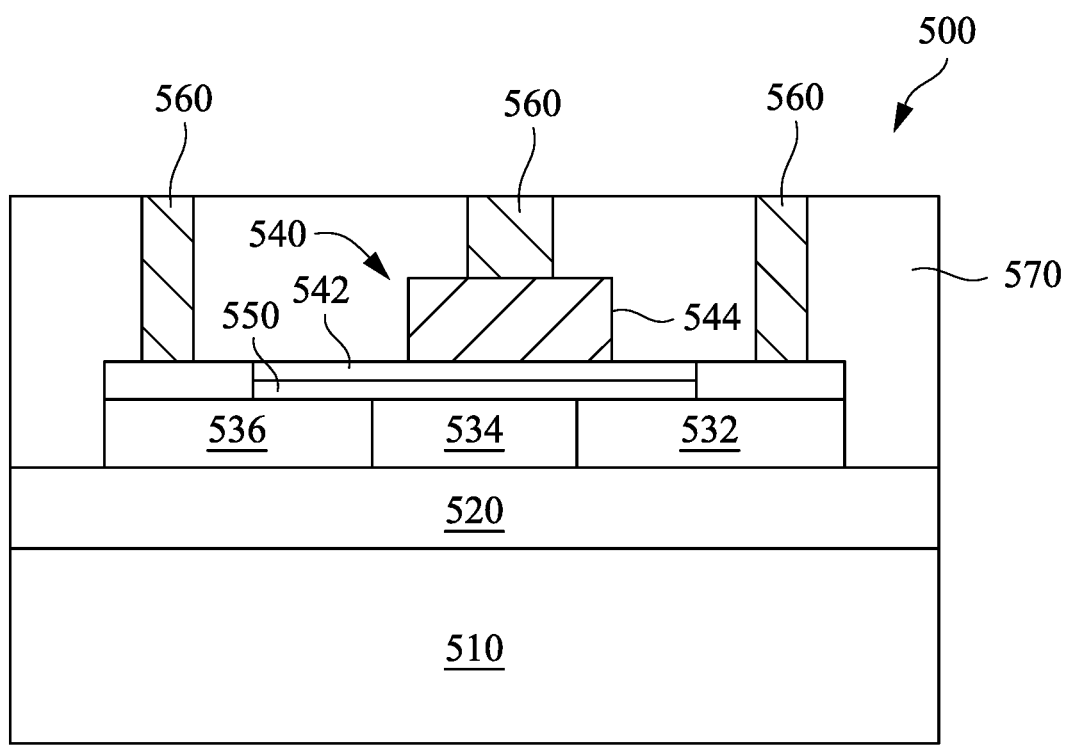

The example TFETS 100, 200, 300 and 400 all are shown with vertical stacks of semiconductor layers of drain layers 132, 232, 332, 432 and source layers 136, 236, 336, 436, for illustrative purposes. The disclosure is not limited by such vertical semiconductor stacks. For example, FIG. 5 shows a lateral TFET 500. The TFET 500 includes a substrate 510, e.g., a silicon substrate and an insulation layer, e.g., a buried oxide (BOX) layer 520 over the substrate. A source region 532, a channel region 534 and a drain region 536 are positioned in a lateral orientation over the BOX layer 520. A gate structure 540 is positioned adjacent to the channel region 534. Specifically, the gate structure 540 may be positioned over the channel region 534 or may wrap around the channel region 534. The gate structure 540 includes a gate dielectric 542 and a gate electrode 544. In an embodiment, the gate structure 540 may also be adjacent to one or more of the source region 532 or the drain region 536.

In an example N-type TFET embodiment, the source region 532 is P-doped GaSb, the channel region 534 is intrinsic or unintentionally N-doped InAs (N$^-$) and the drain region 536 is N-doped InAs (N$^+$). The N-dope drain region 536 includes a higher doping concentration than the unintentionally N-doped channel region 534.

An interlayer 550 is positioned between the channel region 534 and the gate dielectric layer 542. In an embodiment, as shown in FIG. 5, the interlayer 550 is also positioned between the gate dielectric 542 and one or more of the source region 532 or the drain region 536 layer. In an embodiment, the interlayer 550 includes a semiconductor material that has a large conduction band offset with respect to each of the channel region 534, the source region 532 and the drain region 536 such that the conduction band energy of the interlayer 550 is much larger than the trap energy through each of the channel region 534, the source region 532 and the drain region 536. As a consequence, the TAT current is decreased.

The substrate 110, 210, 310, 410, 510 is a silicon substrate or other element semiconductor like germanium or compound semiconductors like as silicon carbide, gallium arsenide, indium arsenide, and/or sapphire. Further, the substrate may also include a silicon-on-insulator (SOI) structure. The substrate may include an epitaxial layer and/or may be strained for performance enhancement. The substrate may also include various doping configurations depending on design requirements as is known in the art such as P-type substrate and/or N-type substrate and various doped regions such as P-wells and/or N-wells.

Further the substrate 110, 210, 310, 410, 510 may include various insulation bodies like shallow trench insulation (STI), deep trench insulation (DTI) and various local field oxide regions that separate active areas/surfaces of device, e.g., the TFET devices.

The gate structures 140, 240, 340, 440 (440O, 440I), 540 are replacement gates of metal or other conductive materials. The following description lists examples of materials for the gate structures. The gate electrodes 144, 244, 344, 544 include a conductive material, e.g., a metal or a metal compound. Suitable metal materials for the gate electrode include ruthenium, palladium, platinum, tungsten, cobalt, nickel, and/or conductive metal oxides and other suitable P-type metal materials and include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, the gate electrode the gate structures include a work function layer tuned to have a proper work function for enhanced performance of the field effect transistor devices. For example, suitable N-type work function metals include Ta, TiAl, TiAlN, TaCN, other N-type work function metals, or a combination thereof; and suitable P-type work function metal materials include TiN, TaN, other P-type work function metals, or combination thereof. In some examples, a conductive layer, such as an aluminum layer, a copper layer, a cobalt layer or a tungsten layer is formed over the work function layer such that the gate electrodes of the gate structures include a work function layer disposed over the gate dielectric layers 142, 242, 342, 542 and a conductive layer disposed over the work function layer and below a gate cap (not shown for simplicity). In an example, the gate electrodes of the gate structures each a thickness ranging from about 5 nm to about 40 nm depending on design requirements.

In example embodiments, the gate dielectric layer 142, 242, 342, 542 include an interfacial silicon oxide layer (not separately shown for simplicity), e.g., a thermal or chemical oxide having a thickness ranging from about 5 to about 10 angstrom (Å). In example embodiments, the dielectric layer 142, 242, 342, 542 further includes a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric contact (K) value of 7 or higher is used. The high-K dielectric layer may be formed by atomic layer deposition (ALD) or other suitable technique. In accordance with embodiments described herein, the high-K dielectric layer of the gate dielectric layer includes a thickness ranging from about 10 to about 30 angstrom (Å) or other suitable thickness. Other dielectric materials can also be used for the gate dielectric layer 142, 242, 342, 542, e.g., MgCaO or Al2O3.

In example embodiments, the inter-level dielectric layer 170, 270, 370, 470, 570 is silicon oxide or a low-K dielectric material. A low-K dielectric material includes as silicon oxynitride, silicon nitride ($Si_3N_4$), silicon monoxide (SiO), silicon oxycarbide (SiOC), vacuum, and other dielectrics or other suitable materials.

Figure 6:
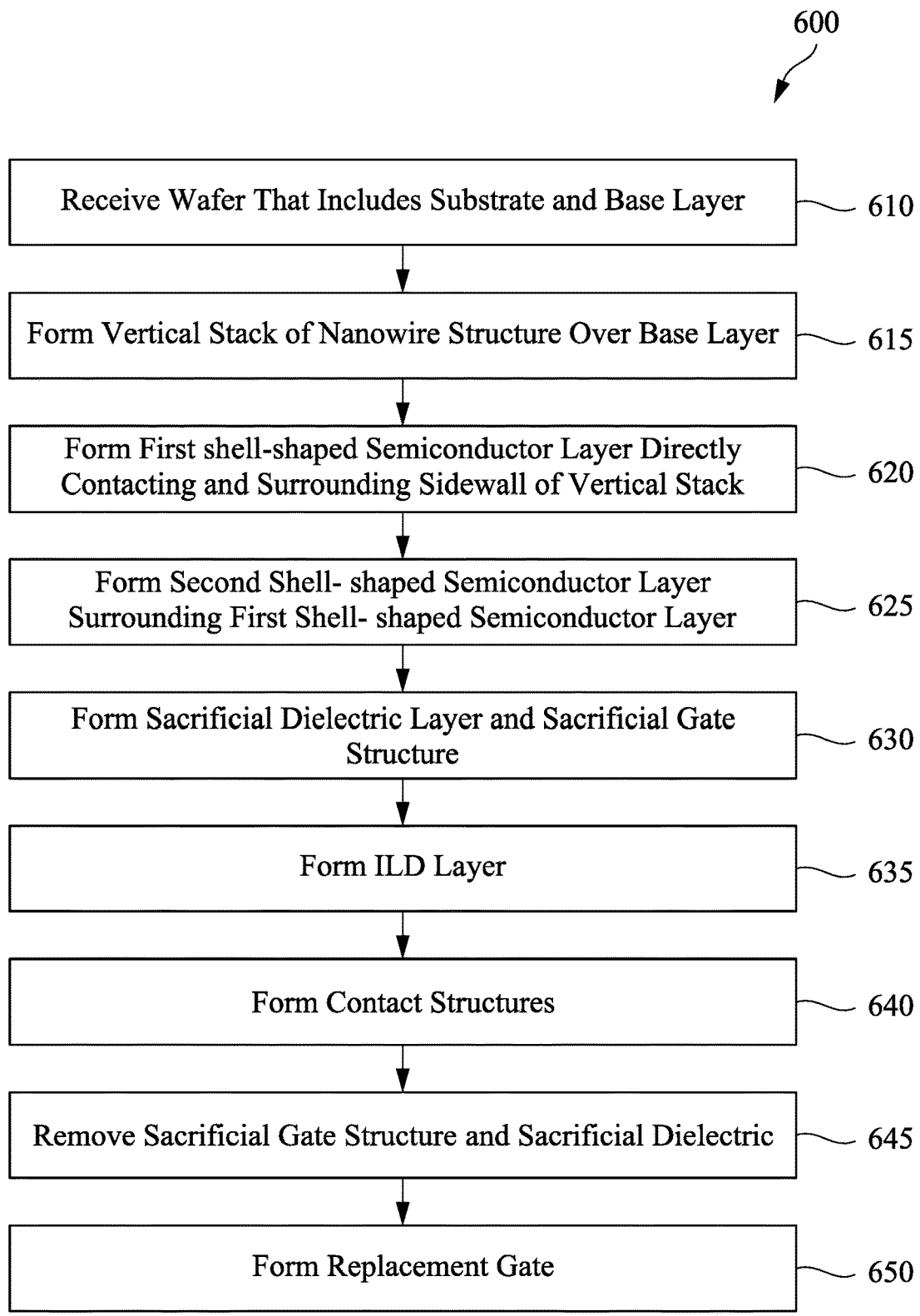
FIG. 6 is an example flow diagram of an example fabricating process according to embodiments of the disclosure.

FIG. 6 shows an example fabrication process 600, which can be used to make the example TFET 300 of FIG. 3 or other devices. In the description herein, the example TFET 300 is used as an example to illustrate the example process 600. FIGS. 7A-7H show various stage of a wafer 700 in making the example TFET 300.

Figure 7A:
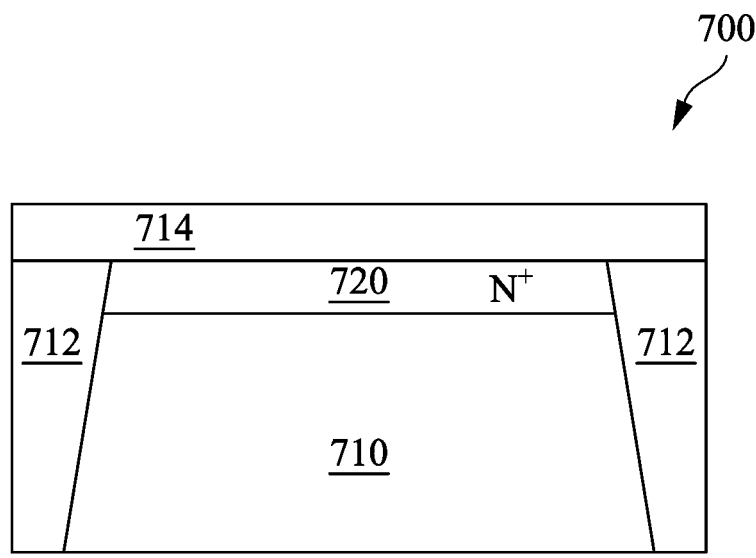
FIGS. 7A-7H illustrate a wafer at various stages of fabrication through the example process of FIG. 6.

Referring to FIG. 6, with reference also FIG. 7A, in example operation 610, a wafer 700 is received. The wafer 700 includes a substrate 710 of a silicon substrate in a crystalline structure, e.g., the Si(111) or Si(001), a base layer 720 of InAs over the substrate 710 and surrounded by STI 712. A mask layer 714 of a dielectric material, e.g., silicon oxide, silicon nitride or another low-K dielectric material, is formed over the base layer 720. The Base layer 720 is doped with a first conductivity type. The base layer 720 of InAs is doped as N-type by supply of additional Si or Ge containing precursors, or is doped as P-type, e.g., by using Mg containing precursors. Other suitable doping procedures, e.g., ion implantation of Si, Ge impurities for N-type or Mg impurities for P-type, are also possible and included in the disclosure. For illustrative purposes, the base layer 720 of InAs is formed with N-type impurity.

The thickness of the base layer 720 is selected based on device design and structural strength considerations, e.g., aspect ratio. To provide a solid base for the subsequent vertical nanowire stack growth over the base layer 720, the InAs base layer 720 is sufficiently thick to provide low dislocation density, e.g., smaller than $10^8$ $cm^{-2}$. In an embodiment, the thickness of the base layer 720 is within a range of about 50 nm to about 200 nm.

In an example, the base layer 720 of InAs nanowire is formed on the substrate 710 using metalorganic chemical vapor deposition (MOCVD) or molecular beam epitaxy (MBE) at temperatures ranging from about 350° C. to about 600° C.

Figure 7B:
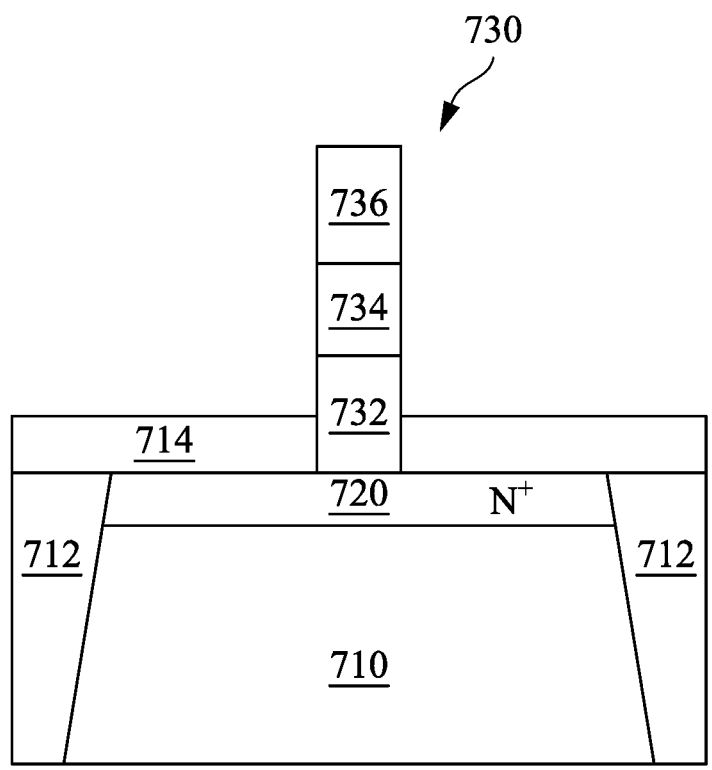

In example operation 615, with reference also to FIG. 7B, a semiconductor nanowire stack 730 is formed on the base InAs layer 720 through the mask layer 714. The nanowire stack 730 includes an InAs nanowire layer 732, a GaAs nanowire layer 734 and a GaSb nanowire layer 736. The nanowire stack 730 may be formed either through a top-down approach or through a bottom-up approach. For example in an bottom-up approach, the nanowire InAs layer 732 is grown via selective area growth (SAG) approaches using MOCVD, vapor-phase epitaxy and/or crystal facet-controlled epitaxial lateral overgrowth (FACELO) techniques or other suitable growth mechanisms in an aperture opened through the mask layer 714. Besides that the mask layer 714 serves the purposes of selective area growth of nanowire InAs layer 732 through an aperture formed in the mask layer 714, other selective area growth techniques, e.g., by using a template hard mask, is also possible and included in the disclosure. The nanowire InAs layer 732 is doped with the first conductivity type as the base layer 720, here e.g., N-type.

An intrinsic or unintentionally doped epitaxy layer of GaAs is formed over the nanowire InAs 732 through MOCVD or MBE. A P-doped ($P^+$) epitaxy layer of GaSb is formed over the epitaxy GaAs layer. The epitaxy GaAs layer and the epitaxy GaSb layer are patterned to form the nanowire GaAs layer 734 and the nanowire GaSb layer 736. The mask layer 714 serves as an etch stop layer in the epitaxy layer patterning. The patterning may be implemented through a selective etch process, for example by KOH solution. Another etching example includes a photo-electrochemical (PEC) treatment and a post-processing wet etch. The PEC treatment converts the unwanted portions to oxide. The oxide portions (side portions) are then removed by wet etching in buffered hydrofluoric acid (HF) and post-etch immersion in potassium hydroxide (KOH) (0.5M) at about 150° C. Other suitable patterning approaches are also possible and included in the disclosure.

Figure 7C:
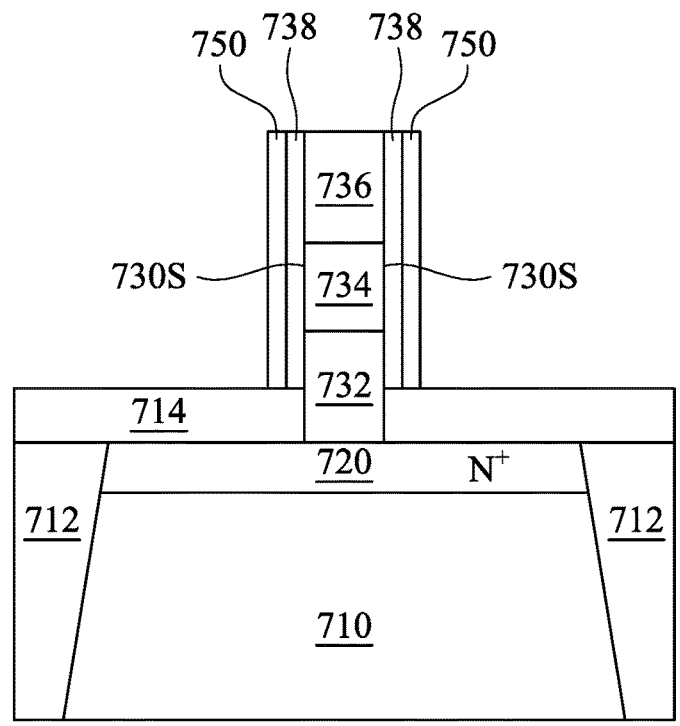

In example operation 620, with reference also to FIG. 7C, a shell-shaped layer 738 of intrinsic or unintentionally doped InAs is formed surrounding a sidewall 730S of the nanowire stack 730. Specifically, the shell-shaped layer 738 contacts both the $N^+$ InAs nanowire layer 732 and the $P^+$ GaSb nanowire layer 736. The shell-shaped layer 738 is formed through an epitaxy process using MOCVD or MBE and with a thickness ranging from about 1.5 nm to about 4 nm.

In example operation 625, a shell-shaped layer 750 of intrinsic or unintentionally doped GaAs is formed surrounding the shell-shaped layer 738. The shell-shaped GaAs layer is further away from the sidewall 730S of the nanowire vertical stack 730 than the shell-shaped InAs layer 738. The shell-shaped layers 738, 750 are each formed through an epitaxy process using MOCVD or MBE and with a thickness ranging from about 1 nm to about 4 nm.

Figure 7D:
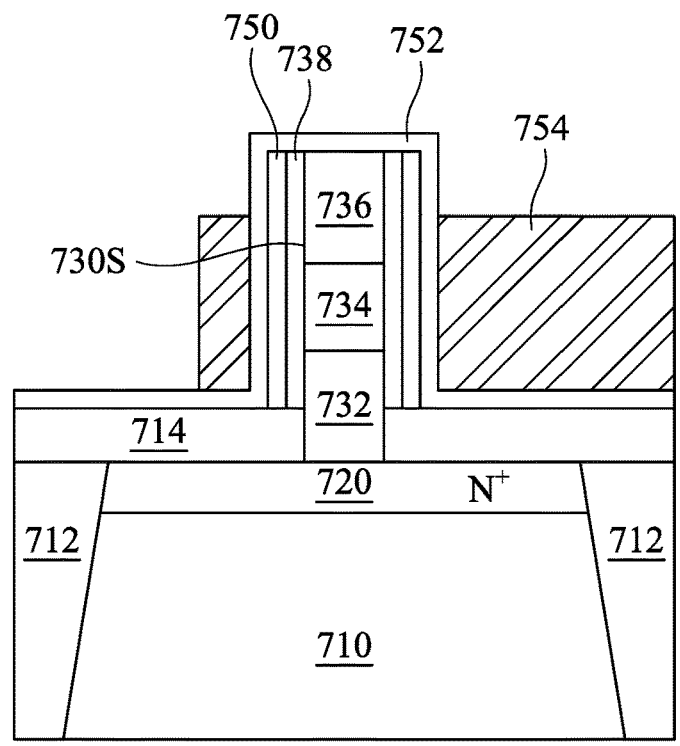

In example operation 630, with reference also to FIG. 7D, a sacrificial dielectric layer 752 is formed surrounding the shell-shaped layer 750 and a sacrificial gate structure 754 is formed and patterned over the sacrificial dielectric layer 752 and also surrounding the shell-shaped layer 750. The sacrificial gate structure 754 is polysilicon or other suitable materials for a replacement gate process. The sacrificial gate structure 754 is further away from the sidewall 730S of the vertical stack 730 than the shell-shaped GaAs layer 750.

Figure 7E:
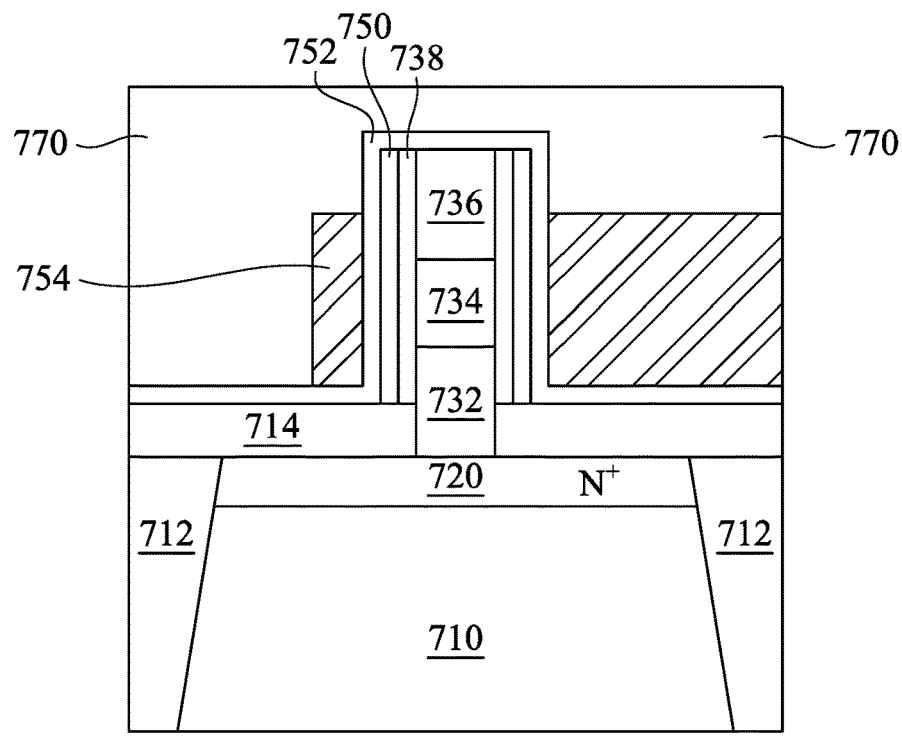

In example operation 635, with reference also to FIG. 7E, inter-level dielectric (ILD) layer 770 is formed. The ILD layer 770 includes a different dielectric material from the sacrificial dielectric layer 752 such that the sacrificial dielectric layer 752 can be selectively removed with the ILD layer 770 remaining.

Figure 7F:
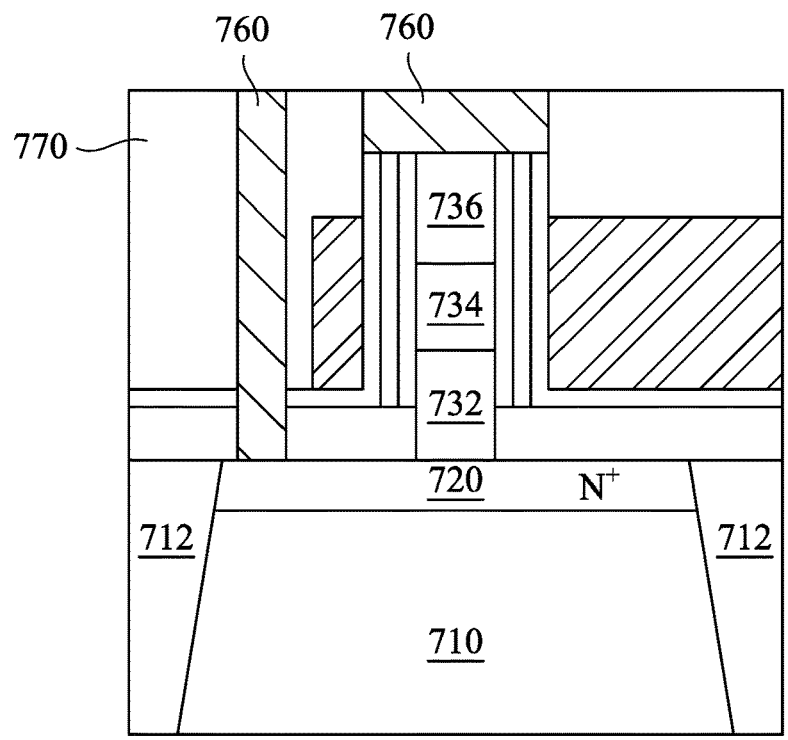

In example operation 640, with reference also to FIG. 7F, contact structures 760 are formed contacting the P$^+$ GaSb nanowire layer 736 and the N$^+$ InAs base layer 720, which is electrically the same layer as the nanowire N$^+$ InAs layer 732. The contact structures 760 are one or more of tungsten W, cobalt Co, copper Cu or other suitable conductive materials.

Figure 7G:
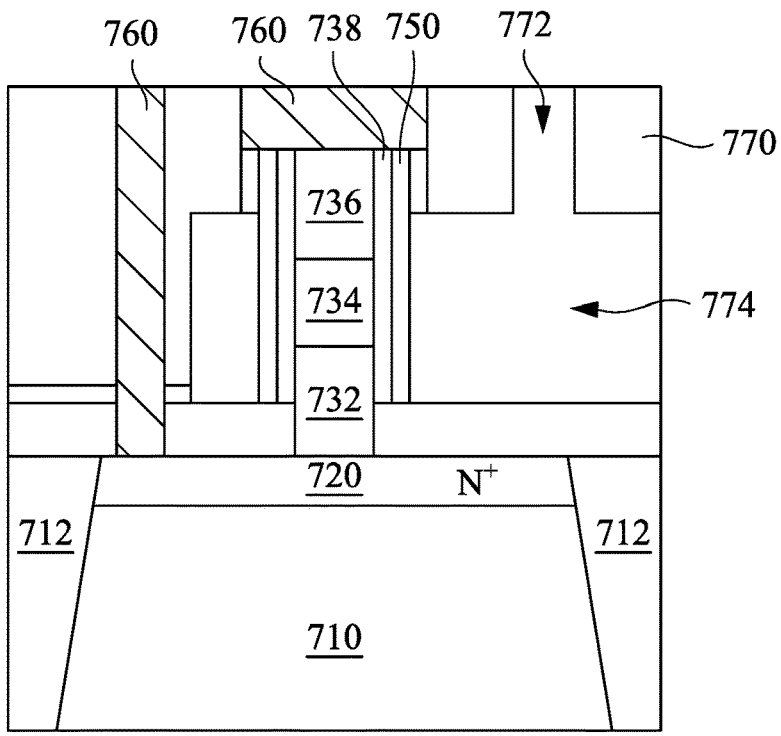

In example operation 645, with reference also to FIG. 7G, a void 772 is formed by removing the sacrificial gate structure 754 and part of the sacrificial dielectric layer 752 through an aperture 772 formed through the ILD layer 770.

Figure 7H:
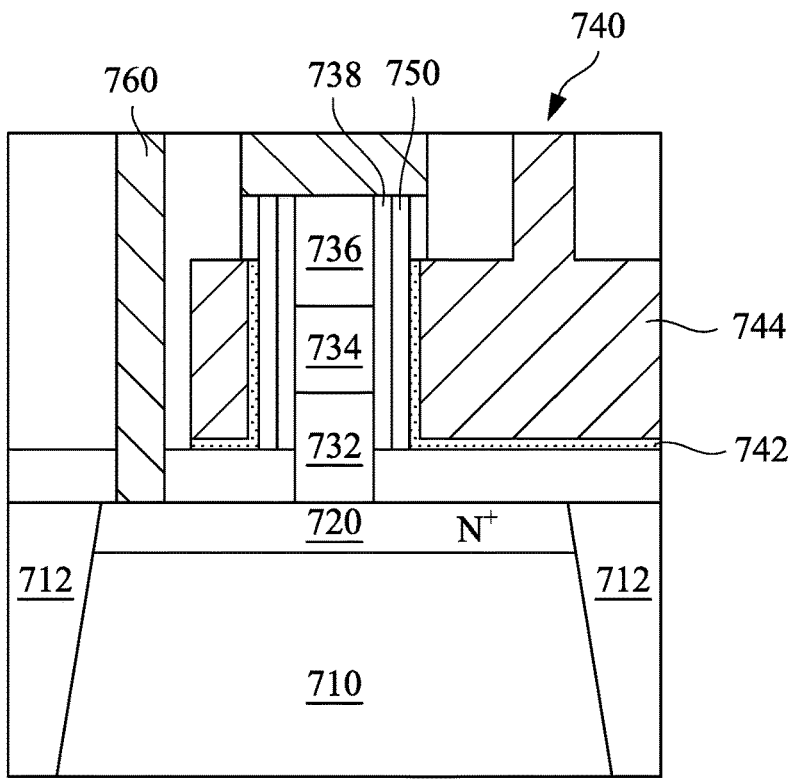

In example operation 650, with reference also to FIG. 7H, replacement gate structure 740 is formed within the void 774. The replacement gate structure 740 includes a high-K gate dielectric layer 742 and a metal gate electrode 744. The high-K gate dielectric layer 742 surrounds the shell-shaped InAs layer 738 with the shell-shaped GaAs layer 750 positioned in-between.

The N$^+$ nanowire InAs layer 732, alone or together with the N$^+$ base layer 720, can be configured as a drain, the P$^+$ GaSb nanowire layer 736 can be configured as a source, the nanowire GaAs layer 734 can be configured as a barrier layer, and the intrinsic or unintentionally doped shell-shaped InAs layer 738 can be configured as a channel layer. The intrinsic or unintentionally doped shell-shaped GaAs layer 750 can be configured as an interlayer that barriers the movement of the charge carrier to the interface with the gate dielectric 742 under the TAT tunneling effect.

The nanowire source/drain layers 736, 732 each may include a thickness ranging from about 20 nm to about 50 nm. The nanowire barrier layer 734 may include a thickness ranging from about 10 nm to about 50 nm.

High-K dielectric material of the gate dielectric 742 may be selected from one or more of hafnium oxide (HfO$_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials ZrO$_2$, Al$_2$O$_3$, LaO, TiO, Ta$_2$O$_5$, Y$_2$O$_3$, STO, BTO, BaZrO, HfLaO.

The High-K gate dielectric layer 742 may be formed by atomic layer deposition (ALD) or other suitable technique. In accordance with embodiments described herein, high-K gate dielectric layer 742 includes a thickness ranging from about 5 to about 25 angstrom (Å) or other suitable thickness.

In an embodiment, the metal gate electrode 744 is tungsten (W) or titanium nitride (TiN). Other suitable materials for metal gate layer may include ruthenium, palladium, platinum, tungsten, cobalt, nickel, and/or conductive metal oxides and other suitable P-type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials.

The metal gate electrode 744 may be formed through sputtering or atomic layer deposition (ALD).

With the interlayer 750, the OFF state leakage under the TAT tunneling effect is substantively reduced while the ON state BTBT tunneling is not affected because the interlayer 750 does not affect the BTBT tunneling. As such, the TFET devices of the disclosure achieve high ON current, low leakage and improved subthreshold swing SS.

The structure and functions of the interlayer may be applied to all types of TFET devices, which are not limited by the specific example TFET structures illustratively shown in the disclosure. For example, the interlayer may be applied in either N-type or P-type TFETs with lateral heterojunctions or vertical heterojunction and including lateral tunneling components and/or vertical tunneling components. The interlayer is positioned between a semiconductor layer where charge carriers are trapped and a heterojunction interface with a gate dielectric layer. The interlayer includes a semiconductor material that has a valence band offset with respect to the semiconductor layer where the charge carrier is trapped such that the trapped charge carriers need to travel more energetic and spatial distance before reaching the interface with the gate dielectric layer from the semiconductor layer where they are initially trapped.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments:

In a structure embodiment, a structure includes a first semiconductor layer doped with a first conductivity type, a second semiconductor layer doped with a second conductivity type, a third semiconductor layer contacting both the first semiconductor layer and the second semiconductor layer, a gate structure adjacent to the third semiconductor layer, and a fourth semiconductor layer between the third semiconductor layer and the gate structure. The fourth semiconductor layer has a semiconductor material different from the third semiconductor layer. The second semiconductor layer is separated from the first semiconductor layer.

In a device embodiment, a device includes a base layer of a first semiconductor material, a first nanowire source/drain region of the first semiconductor material overlaying the base layer, a second nanowire source/drain region overlaying the first nanowire source/drain region, a channel region contacting both the first nanowire source/drain region and the second nanowire source/drain region, a gate structure laterally adjacent to the channel region, and an interlayer of a second semiconductor material laterally between the channel region and the gate structure, the second semiconductor material being different from the first semiconductor material.

A method embodiment receives a wafer that includes a base layer of a first III-V compound semiconductor material over a substrate. A vertical stack of nanowire structures is formed over the base layer. The vertical stack includes a first nanowire structure of the first III-V compound semiconductor material and a second nanowire structure of a second III-V compound semiconductor material overlaying the first nanowire semiconductor structure. The first nanowire structure is doped as a first electronic conductivity type, and the second nanowire semiconductor structure is doped as a second electronic conductivity type. A first shell-shaped semiconductor layer is formed directly contacting and surrounding a sidewall of the vertical stack of nanowire structures. A second shell-shaped semiconductor layer is formed surrounding the first shell-shaped semiconductor layer. The second shell-shaped semiconductor layer has a different semiconductor material from the first shell-shaped semiconductor layer. The second shell-shaped semiconductor is further away from the sidewall of the vertical stack than the first shell-shaped semiconductor layer. A gate structure is formed surrounding the second shell-shaped semiconductor layer. The gate structure is further away from the sidewall of the vertical stack than the second shell-shaped semiconductor layer.

The invention claimed is:

1. A structure, comprising:
   a first semiconductor layer doped with a first conductivity type;
   a second semiconductor layer doped with a second conductivity type, the second semiconductor layer being separated from the first semiconductor layer;
   a third semiconductor layer contacting both the first semiconductor layer and the second semiconductor layer;
   a gate structure adjacent to the third semiconductor layer;
   aid a fourth semiconductor layer between the third semiconductor layer and the gate structure, the fourth semiconductor layer having a semiconductor material different from the third semiconductor layer; and
   a fifth semiconductor layer positioned between the first semiconductor layer and the second semiconductor layer, the fifth semiconductor layer including a larger tunneling barrier than the third semiconductor layer with respect to the first semiconductor layer.

2. The structure of claim 1, wherein the semiconductor material of the fourth semiconductor layer includes a conduction band offset with respect to a semiconductor material of the third semiconductor layer.

3. The structure of claim 1, wherein the semiconductor material of the fourth semiconductor layer includes a wider bandgap than a semiconductor material of the third semiconductor layer.

4. The structure of claim 1, wherein the semiconductor material of the fourth semiconductor layer includes a conduction band offset with respect to a semiconductor material of one or more of the first semiconductor layer or the second semiconductor layer.

5. The structure of claim 1, wherein the fourth semiconductor layer completely overlaps the third semiconductor layer in a lateral direction between the third semiconductor layer and the gate structure.

6. The structure of claim 1, wherein the first semiconductor layer is ring-shaped and the third semiconductor layer and the fourth semiconductor layer extend inside the ring-shaped first semiconductor layer.

7. The structure of claim 1, wherein the first semiconductor layer is ring-shaped and the third semiconductor layer and the fourth semiconductor layer extend outside the ring-shaped first semiconductor layer.

8. The structure of claim 1, wherein the third semiconductor layer is positioned between the first semiconductor layer and the second semiconductor layer and the gate structure is also adjacent to at least one of the first semiconductor layer or the second semiconductor layer.

9. The structure of claim 8, wherein the fourth semiconductor layer is positioned between the gate structure and the at least one of the first semiconductor layer or the second semiconductor layer that is adjacent to the gate structure.

10. The structure of claim 8, wherein the third semiconductor layer extends by a sidewall of at least one of the first semiconductor layer or the second semiconductor layer.

11. The structure of claim 1, wherein the first semiconductor layer and the fourth semiconductor layer are III-V compound semiconductors.

12. The structure of claim 11, wherein the first semiconductor layer is InAs, the second semiconductor layer is GaSb, the third semiconductor layer is InAs and the fourth semiconductor layer is one or more of GaAs or InP.

13. A device, comprising:
   a base layer of a first semiconductor material;
   a first nanowire source/drain region of the first semiconductor material overlaying the base layer;
   a second nanowire source/drain region overlaying the first nanowire source/drain region;
   a channel region contacting both the first nanowire source/drain region and the second nanowire source/drain region;
   a gate structure laterally adjacent to the channel region; and
   an interlayer of a second semiconductor material laterally between the channel region and the gate structure, the second semiconductor material being different from the first semiconductor material;
   wherein the channel region is a shell-shaped layer surrounding the first nanowire source/drain region and the second nanowire source/drain region; and
   wherein the first nanowire source/drain region has a ring-shaped profile and the shell-shaped channel region surrounds the ring-shaped first nanowire source/drain region from at least one of an inner sidewall or an outer sidewall of the ring-shaped first nanowire source/drain region.

14. The device of claim 13, wherein the gate structure is at least one of adjacent to the outer sidewall of the of the ring-shaped first nanowire source/drain region or adjacent to the inner sidewall of the ring-shaped first nanowire source/drain region.

15. The device of claim 13, wherein the interlayer is shell-shaped.

16. A structure, comprising:
a substrate;
a base layer of a first III-V compound semiconductor material over the substrate;
a vertical stack of nanowire structures over the base layer, the vertical stack including a first nanowire structure of the first III-V compound semiconductor material and a second nanowire structure of a second III-V compound semiconductor material overlaying the first nanowire semiconductor structure, the first nanowire structure being doped as a first electronic conductivity type, and the second nanowire semiconductor structure being doped as a second electronic conductivity type;
a first shell-shaped semiconductor layer directly contacting and surrounding a sidewall of the vertical stack of nanowire structures;
a second shell-shaped semiconductor layer surrounding the first shell-shaped semiconductor layer, the second shell-shaped semiconductor layer having a different semiconductor material from the first shell-shaped semiconductor layer and the second shell-shaped semiconductor being further away from the sidewall of the vertical stack than the first shell-shaped semiconductor layer; and
a gate structure surrounding the second shell-shaped semiconductor layer, the gate structure being further away from the sidewall of the vertical stack than the second shell-shaped semiconductor layer.

17. The structure of claim 16, wherein the semiconductor material of the second shell-shaped semiconductor layer includes a conduction band offset with respect to a semiconductor material of the first shell-shaped semiconductor layer.

* * * * *